(12) United States Patent
Zhang et al.

(10) Patent No.: US 11,903,276 B2
(45) Date of Patent: Feb. 13, 2024

(54) DISPLAY PANEL, MANUFACTURING METHOD THEREFOR, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhen Zhang, Beijing (CN); Ning Zhao, Beijing (CN); Xinwei Wu, Beijing (CN); Xudong An, Beijing (CN); Yue Wei, Beijing (CN); Yuqing Yang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 400 days.

(21) Appl. No.: 17/415,469

(22) PCT Filed: Oct. 12, 2020

(86) PCT No.: PCT/CN2020/120317
§ 371 (c)(1),
(2) Date: Jun. 17, 2021

(87) PCT Pub. No.: WO2021/098406
PCT Pub. Date: May 27, 2021

(65) Prior Publication Data
US 2022/0069054 A1 Mar. 3, 2022

(30) Foreign Application Priority Data
Nov. 20, 2019 (CN) .......................... 201911138657.3

(51) Int. Cl.
*H01L 27/32* (2006.01)
*H10K 59/131* (2023.01)
(Continued)

(52) U.S. Cl.
CPC .......... *H10K 59/131* (2023.02); *H10K 50/84* (2023.02); *H10K 59/124* (2023.02); *H10K 71/00* (2023.02); *H10K 59/1201* (2023.02)

(58) Field of Classification Search
CPC .... H10K 59/131; H10K 50/84; H10K 59/124; H10K 71/00; H10K 59/1201;
(Continued)

(56) References Cited

U.S. PATENT DOCUMENTS

2015/0270320 A1  9/2015 Yang
2016/0149155 A1  5/2016 Kim
(Continued)

FOREIGN PATENT DOCUMENTS

CN  103413898 A  11/2013
CN  106887523 A   6/2017
(Continued)

*Primary Examiner* — Mohammed R Alam
(74) *Attorney, Agent, or Firm* — The Webb Law Firm

(57) ABSTRACT

Provided are a display panel, a manufacturing method therefor, and a display device. The display panel comprises a hole in a display region and comprises: a substrate; a drive circuit layer comprising a thin film transistor; a wire, connected to the thin film transistor; one or more isolation members surrounding the hole, disposed on the side of the drive circuit layer, and located between the wire and the hole, at least one isolation member comprising a first and a second isolation layer, and an orthographic projection of a surface of the first isolation layer away from the substrate is inside that of the second isolation layer on the substrate; a planarization layer, on the side of the drive circuit layer and covering the wire; and an anode, on the side of the planar-
(Continued)

ization layer and connected to the wire by a via penetrating the planarization layer.

20 Claims, 6 Drawing Sheets

(51) Int. Cl.
*H10K 50/84* (2023.01)
*H10K 59/124* (2023.01)
*H10K 71/00* (2023.01)
*H10K 59/12* (2023.01)

(58) Field of Classification Search
CPC .... H10K 50/844; H10K 50/818; H10K 59/00; H10K 59/65; H10K 59/12
See application file for complete search history.

(56) References Cited

U.S. PATENT DOCUMENTS

| | | | |
|---|---|---|---|
| 2019/0027546 A1 | 1/2019 | Lee | |
| 2021/0028249 A1 | 1/2021 | Ding et al. | |
| 2021/0273026 A1* | 9/2021 | Seo | H10K 59/00 |

FOREIGN PATENT DOCUMENTS

| | | | |
|---|---|---|---|
| CN | 110246984 A | 9/2019 | |
| CN | 110265583 A | 9/2019 | |
| CN | 110649177 A | 1/2020 | |
| CN | 110676302 A | 1/2020 | |
| CN | 111180496 A | 5/2020 | |
| IN | 109802052 A | 5/2019 | |

\* cited by examiner

DISPLAY PANEL, MANUFACTURING METHOD THEREFOR, AND DISPLAY DEVICE

CROSS-REFERENCE TO RELATED APPLICATIONS

The present application is a U.S. National Stage Application under 35 U.S.C. § 371 of International Patent Application No. PCT/CN2020/120317, filed on Oct. 12, 2020, which claims priority to Chinese Patent Application No. 201911138657.3 filed on Nov. 20, 2019, the disclosures of both of which are incorporated by reference herein in their entirety.

TECHNICAL FIELD

The present disclosure relates to a display panel, a manufacturing method therefor, and a display device.

BACKGROUND

At present, in order to obtain a higher screen-to-body ratio, a display area of a display panel may be provided with a hole, in which a camera or a sensor is disposed.

However, moisture and oxygen are likely to enter a light emitting device layer through an edge of the light emitting device layer close to the hole, thereby affecting the display effect of the display panel.

SUMMARY

According to one aspect of the embodiments of the present disclosure, a display panel comprising a hole located in a display area is provided. The display panel comprises: a substrate; a driving circuit layer located on one side of the substrate and comprising a thin film transistor; a trace located on one side of the driving circuit layer away from the substrate and connected to the thin film transistor; one or more separators surrounding the hole, located on one side of the driving circuit layer away from the substrate and located between the trace and the hole, wherein at least one separator of the one or more separators comprises: a first separation layer, and a second separation layer located on one side of the first separation layer away from the driving circuit layer, wherein an orthographic projection of one surface of the first separation layer away from the substrate on the substrate is within an orthographic projection of the second separation layer on the substrate; a planarization layer located on the one side of the driving circuit layer away from the substrate and covering the trace, the planarization layer not overlapping with the one or more separators; and an anode located on one side of the planarization layer away from the driving circuit layer and connected to the trace through a via hole penetrating through the planarization layer.

In some embodiments, the at least one separator further comprises: a third separation layer located on one side of the first separation layer close to the driving circuit layer, wherein an orthographic projection of the first separation layer on the substrate is within an orthographic projection of the third separation layer on the substrate.

In some embodiments, the trace comprises: a first trace layer, wherein a material of the first trace layer is the same as a material of the first separation layer; a second trace layer located on one side of the first trace layer away from the driving circuit layer, wherein a material of the second trace layer is the same as a material of the second separation layer; and a third trace layer located on one side of the first trace layer close to the driving circuit layer, wherein a material of the third trace layer is the same as a material of the third separation layer.

In some embodiments, the display panel further comprises a light emitting device layer, wherein the light emitting device layer comprises: a first light emitting device layer located on the anode and extending to the driving circuit layer on one side of the at least one separator away from the hole; and a second light emitting device layer located on the second separation layer and spaced apart from the first light emitting device layer.

In some embodiments, the light emitting device layer further comprises: a third light emitting device layer extending from an edge of the hole to the driving circuit layer on one side of the at least one separator close to the hole, third light emitting device layer being spaced apart from the second light emitting device layer.

In some embodiments, the light emitting device layer further comprises: a fourth light emitting device layer located on the driving circuit layer between adjacent separators of the one or more separators, the fourth light emitting device layer being spaced apart from the second light emitting device layer.

In some embodiments, the light emitting device layer comprises a functional layer and a cathode located on one side of the functional layer away from the substrate.

In some embodiments, the display panel further comprises: at least one dam surrounding the hole and located on the one side of the driving circuit layer away from the substrate, wherein the one or more separators are located between the planarization layer and the at least one dam.

In some embodiments, the display panel further comprises: a crack stop member located on the one side of the driving circuit layer away from the substrate and located between the at least one dam and the hole.

In some embodiments, the anode comprises: a first anode layer; a second anode layer located on one side of the first anode layer away from the driving circuit layer; and a third anode layer located on one side of the first anode layer close to the driving circuit layer.

In some embodiments, materials of the second anode layer and the third anode layer comprise indium tin oxide, and a material of the first anode layer comprises silver.

In some embodiments, materials of the second separation layer and the third separation layer comprise titanium, and a material of the first separation layer comprises aluminum or molybdenum.

According to another aspect of the embodiments of the present disclosure, provided is a display device, comprising the display panel according to any one of the above embodiments.

According to still another aspect of the embodiments of the present disclosure, provided is a a method for manufacturing a display panel, comprising: providing a substrate structure, wherein the substrate structure comprises: a substrate comprising a first area for forming a hole of a display area, a driving circuit layer located on one side of the substrate and comprising a thin film transistor, a trace located on one side of the driving circuit layer away from the substrate and connected to the thin film transistor, one or more separators surrounding the first area and located on the one side of the driving circuit layer away from the substrate, wherein at least one separator of the one or more separators comprises a first separation material layer and a second separation layer located on one side of the first separation material layer away from the driving circuit layer, and a planarization layer located on one side of the driving circuit layer away from the substrate and covering the trace, the planarization layer not overlapping with the one or more separators; forming an anode material layer covering the substrate structure; and etching the anode material layer and at least one side surface of the first separation material layer to form an anode and a first separation layer, wherein the anode is connected to the trace through a via hole penetrating through the planarization layer, and an orthographic projection of one surface of the first separation layer away from the substrate on the substrate is within an orthographic projection of the second separation layer on the substrate.

In some embodiments, etching the anode material layer and at least one side surface of the first separation material layer comprises: forming a first mask on one side of the anode material layer away from the substrate, wherein the anode material layer comprises a first anode material layer covering the planarization layer, and a second anode material layer adjacent to the first anode material layer and covering the one or more separators, and the first mask exposes a portion of the first anode material layer; performing a first etching, with the first mask as a mask, on the exposed portion of the first anode material layer to form the anode; removing the first mask; forming a second mask covering the anode, wherein the second mask exposes the second anode material layer and a remaining portion of the first anode material layer; perform a second etching, with the second mask as a mask, on the second anode material layer, the remaining portion of the first anode material layer, and the at least one side surface of the first separation material layer to form the first separation layer; and removing the second mask.

In some embodiments, the at least one separator further comprises: a third separation layer located on one side of the first separation layer close to the driving circuit layer, wherein an orthographic projection of the first separation layer on the substrate is within an orthographic projection of the third separation layer on the substrate.

In some embodiments, the trace comprises: a first trace layer; a second trace layer located on one side of the first trace layer away from the driving circuit layer; and a third trace layer located on one side of the first trace layer close to the driving circuit layer, wherein: the first trace layer and the first separation material layer are formed by a first patterning process, the second trace layer and the second separation layer are formed by a second patterning process, and the third trace layer and the third separation layer are formed by a third patterning process.

In some embodiments, each of the first etching and the second etching comprises wet etching.

In some embodiments, the method further comprises forming a light emitting device layer, wherein the light emitting device layer comprises: a first light emitting device layer located on the anode and extending to the driving circuit layer on one side of the at least one separator away from the hole; and a second light emitting device layer located on the second separation layer and spaced apart from the first light emitting device layer.

In some embodiments, the light emitting device layer further comprises: a third light emitting device layer extending from an edge of the hole to the driving circuit layer on one side of the at least one separator close to the hole, the third light emitting device layer being spaced apart from the second light emitting device layer.

In some embodiments, forming the light emitting device layer comprises: forming a functional layer; and forming a cathode located on one side of the functional layer away from the substrate.

Other features, aspects and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and together with this specification, serve to explain the principles of the present disclosure.

The present disclosure may be more clearly understood from the following detailed description with reference to the accompanying drawings, in which.

Figure 1A:
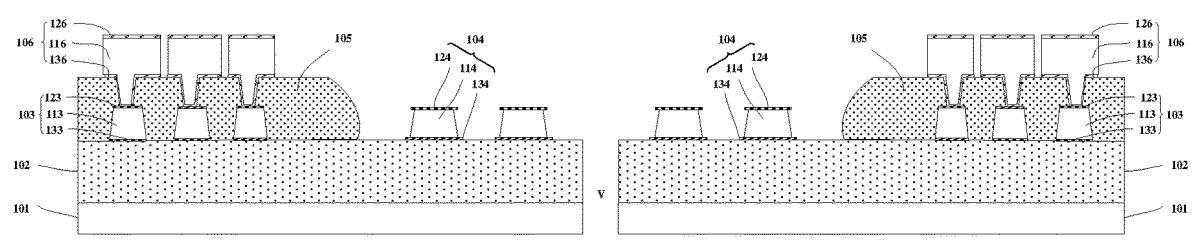
FIG. 1A is a schematic structure view showing a display panel according to an embodiment of the present disclosure.

It should be understood that the dimensions of the various parts shown in the accompanying drawings are not necessarily drawn according to actual scaling relations. In addition, the same or similar components are denoted by the same or similar reference signs.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

Figure 1B:
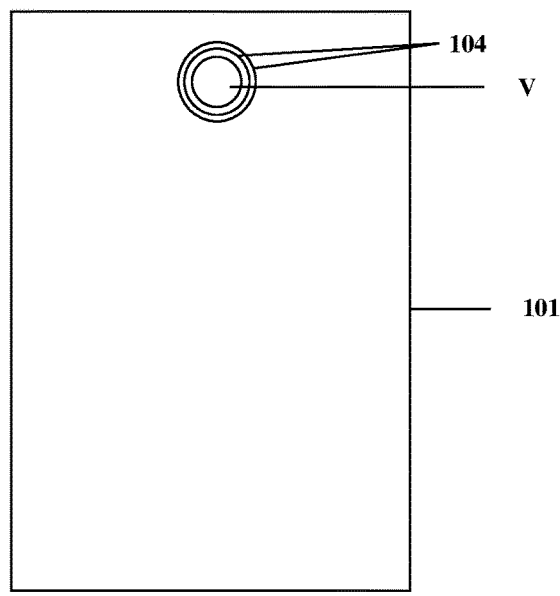
FIG. 1B is a schematic top view showing a display panel according to an embodiment of the present disclosure.

FIG. 1A is a schematic structure view showing a display panel according to an embodiment of the present disclosure. FIG. 1B is a schematic top view showing a display panel according to an embodiment of the present disclosure.

As shown in FIG. 1A and FIG. 1B, the display panel may comprise a hole V located at the display area. The number of the hole V may be one or more than one. The hole V may be configured to mount a camera, a sensor or the like. For example, the hole V may be a through hole penetrating through the display panel. For another example, the hole V may be a blind hole.

The display panel comprises a substrate 101, a driving circuit layer 102 located on one side of the substrate 101, a trace 103, one or more separators 104 surrounding the hole V, a planarization layer 105 and an anode 106.

The substrate 101 may comprise, for example, a flexible substrate such as a polyimide (PI) substrate or the like.

The driving circuit layer 102 comprises a thin film transistor. It should be understood that the driving circuit layer 102 may comprise a pixel driving circuit, which may comprise a plurality of thin film transistors, such as a driving transistor, a switching transistor, or the like. The pixel driving circuit may also comprise a capacitor or the like.

The trace 103 is located on one side of the driving circuit layer 102 away from the substrate 101 and connected to the thin film transistor in the driving circuit layer 102. For example, the trace 103 may be connected to a drain of the thin film transistor. Here, FIG. 1A shows a plurality of traces 103 spaced apart. Each trace 103 may be connected to a corresponding thin film transistor.

The separator 104 is located on one side of the driving circuit layer 102 away from the substrate 101 and located between the trace 103 and the hole V. At least one separator 104 comprises a first separation layer 114 and a second separation layer 124. The second separation layer 124 is located on one side of the first separation layer 114 away from the driving circuit layer 102, that is, located above the first separation layer 114. Here, the orthographic projection of one surface (i.e., the upper surface) of the first separation layer 114 away from the substrate 101 on the substrate 101 is within the orthographic projection of the second separation layer 124 on the substrate 101. In other words, the first separation layer 114 and the second separation layer 124 allow at least one side surface of the separator 104 to have a notch. In some embodiments, the orthographic projection of one surface (i.e., the lower surface) of the first separation layer 114 close to the substrate 101 on the substrate 101 is also within the orthographic projection of the second separation layer 124 on the substrate 101.

The planarization layer 105 is located on one side of the driving circuit layer 102 away from the substrate 101 and covers the trace 103. Here, the planarization layer 105 does not overlap with the separator 104. In other words, the orthographic projection of the planarization layer 105 on the substrate 101 does not overlap with the orthographic projection of each separator 104 on the substrate 101. In some implementations, the material of the planarization layer 105 may comprise organic insulating materials such as PI, polyphthalimide, polyphthalamide, acrylic resin, benzocyclobutene, or phenol resin.

The anode 106 is located on one side of the planarization layer 105 away from the driving circuit layer 102. The anode 106 may be connected to the trace 103 through a via hole penetrating through the planarization layer 105. FIG. 1A shows a plurality of anodes 106, and each anode 106 may be connected to a corresponding trace 103. In some implementations, the anode 106 may comprise a first anode layer 116, a second anode layer 126, and a third anode layer 136. The second anode layer 126 is located on one side of the first anode layer 116 away from the driving circuit layer 102, and the third anode layer 136 is located on one side of the first anode layer 116 close to the driving circuit layer 102. In some implementations, the materials of the second anode layer 126 and the third anode layer 136 may comprise indium tin oxide or indium zinc oxide, and the material of the first anode layer 116 may comprise silver.

In the above embodiments, the display panel comprises one or more separators surrounding the hole. The orthographic projection of one surface of the first separation layer of the separator away from the substrate on the substrate is within the orthographic projection of the second separation layer on the substrate. Such a display panel is favorable for implementing that the light emitting device layer formed above the separator is spaced apart from the light emitting device layer formed above the anode, such that moisture and oxygen entering the light emitting device layer from the hole can be blocked from diffusing to the light emitting device layer above the anode, thereby reducing an adverse effect on the light emitting device, and improving the display effect of the display panel.

In some embodiments, referring to FIG. 1A, the separator 104 may further comprise a third separation layer 134. The third separation layer 134 is located on one side of the first separation layer 114 close to the driving circuit layer 101. Here, the orthographic projection of the first separation layer 114 on the substrate 101 is within the orthographic projection of the third separation layer 134 on the substrate 101. As some implementations, the materials of the second separation layer 124 and the third separation layer 134 may comprise titanium, and the material of the first separation layer 114 may comprise aluminum or molybdenum. The second separation layer 124 and the third separation layer 134 may function to protect the first separation layer 114, for example, may prevent the first separation layer 114 from oxidization.

In the above embodiments, the orthographic projection of the first separation layer on the substrate is within the orthographic projection of the third separation layer on the substrate. Such a display panel is more favorable for implementing that the light emitting device layer above the separator is spaced apart from the light emitting device layer formed above the anode, which further improves the display effect of the display panel.

In some embodiments, referring to FIG. 1A, the trace 103 may comprise a first trace layer 113, a second trace layer 123 and a third trace layer 133. The second trace layer 123 is located on one side of the first trace layer 113 away from the driving circuit layer 102, and the third trace layer 133 is located on one side of the first trace layer 113 close to the driving circuit layer 102. For example, the material of the first trace layer 113 is the same as that of the first separation layer 114. For example, the material of the second trace layer 123 is the same as that of the second separation layer 124. For example, the material of the third trace layer 133 is the same as that of the third separation layer 134.

In some implementations, the first trace layer 113 and the first separation layer 114 maybe formed by a same patterning process. In some implementations, the second trace layer 123 and the second separation layer 124 may be formed by a same patterning process. In some implementations, the third trace layer 133 and the third separation layer 134 may be formed by a same patterning process. It should be noted that, in the present disclosure, "by a same patterning process" means patterning a same material layer.

Figure 2:
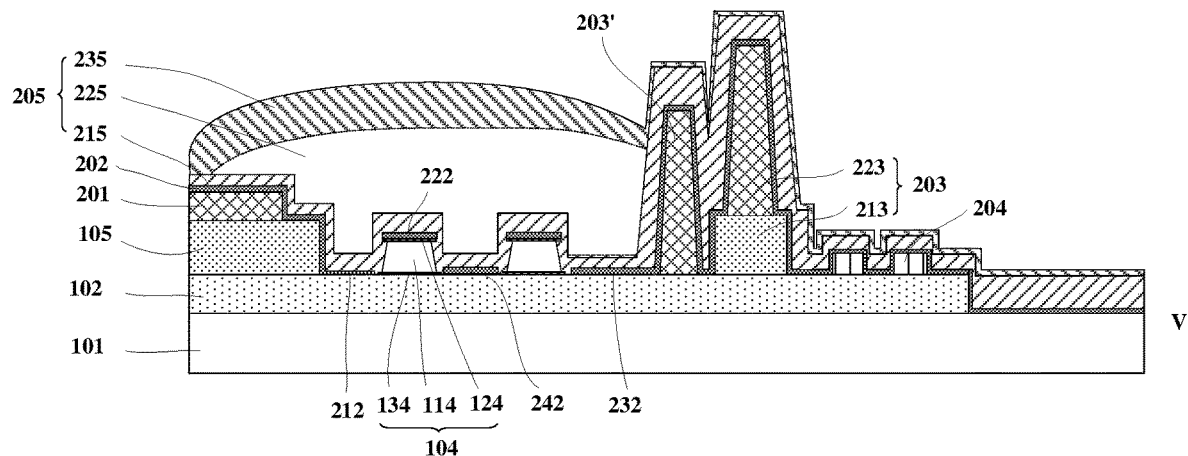
FIG. 2 is a schematic structure view showing a display panel according to another embodiment of the present disclosure.

FIG. 2 is a schematic structure view showing a display panel according to another embodiment of the present disclosure. It should be noted that, in order to show the difference between FIG. 2 and FIG. 1A more explicitly, FIG. 2 only shows the structure of the display panel located on a left side of the hole V. It should be understood that the structure of the display panel on the right side of the hole V is symmetrical to the structure on the left side of the hole V with respect to the hole V.

In addition, although FIG. 2 does not show the anode 106, it should be understood that the anode 106 comprised in the display panel in FIG. 2 is similar to that in FIG. 1A.

As shown in FIG. 2, the display panel further comprises a light emitting device layer 202. For example, the light emitting device layer 202 comprises a functional layer and a cathode located on one side of the functional layer away from the substrate 101. In some embodiments, the functional layer may comprise a light emitting layer, for example, an organic light emitting layer. In other embodiments, the functional layer may further comprise one or more of an electron transport layer, an electron injection layer, a hole transport layer, and a hole injection layer.

The light emitting device layer 202 comprises a first light emitting device layer 212 located on the anode 106 and a second light emitting device layer 222 located on the second separation layer 124. The first light emitting device layer 212 above the anode 106 extends to the driving circuit layer 102 on one side of the at least one separator 104 away from the hole V. The second light emitting device layer 222 is spaced apart from the first light emitting device layer 212.

Since the second light emitting device layer 222 is spaced apart from the first light emitting device layer 212, even if moisture and oxygen enter the light emitting device layer 202 through the edge of the hole V, moisture and oxygen cannot enter the first light emitting device layer 212. In this way, an adverse effect of moisture and oxygen on the light emitting device is reduced, and the display effect of the display panel is improved.

In some embodiments, referring to FIG. 2, the light emitting device layer 202 may comprise a third light emitting device layer 232. The third light emitting device layer 232 extends from the edge of the hole V to the driving circuit layer 232 on one side of the at least one separator 104 close to the hole V. Here, the third light emitting device layer 232 is spaced apart from the second light emitting device layer 222.

Since the third light emitting device layer 232 is spaced apart from the second light emitting device layer 222, even if moisture and oxygen enter the third light emitting device layer 232 through the edge of the hole V, moisture and oxygen cannot enter the second light emitting device layer 222, and further cannot enter the first light emitting device layer 212. In this way, the effect of moisture and oxygen on the light emitting device can be better reduced, and the display effect of the display panel is further improved.

It should be understood that in a case where the display panel comprises a plurality of separators 104, the light emitting device layer 202 may comprise a fourth light emitting device layer 242 located on the driving circuit layer 102 between adjacent separators 104. The fourth light emitting device layer 242 is spaced apart from the second light emitting device layer 222 on the second separation layer 124.

In some embodiments, referring to FIG. 2, the display panel may further comprise at least one dam surrounding the hole V, for example, a dam 203 and a dam 203'. Here, the dam 203/203' is located on one side of the driving circuit layer 102 away from the substrate 101. One or more separators 104 in the display panel are located between the planarization layer 105 and at least one dam (for example, the dam 203').

For example, the dam 203 may comprise a first dam portion 213 and a second dam portion 223 located on the first dam portion 213. In some implementations, the material of the first dam portion 213 may be the same as that of the planarization layer 105. For example, the planarization layer 105 and the first dam portion 213 may be formed by a same patterning process. In some implementations, the material of the second dam portion 223 may be the same as that of the pixel defining layer 201. For example, the pixel defining layer 201 and the second dam portion 223 may be formed by a same patterning process. In some implementations, the material of the dam 203' may be the same as that of the pixel defining layer 201. For example, the pixel defining layer 201 and the dam 203' may be formed by a same patterning process.

The dam 203/203' can block the flow of the organic layer 225 in the encapsulation layer 205 to prevent the organic layer 225 from flowing to the hole V. In some embodiments, the height of the dam 203 may be greater than that of the dam 203', thereby blocking the flow of the organic layer 225 more effectively.

It should be understood that the encapsulation layer 205 may further comprise a first inorganic layer 215 and a second inorganic layer 235. The first inorganic layer 215 is located on one side of the organic layer 225 close to the substrate 101, and the second inorganic layer 235 is located on one side of the organic layer 225 away from the substrate 101. As some implementations, the materials of the first inorganic layer 215 and the second inorganic layer 235 may comprise silicon oxide, silicon nitride, silicon oxynitride, or the like. As some implementations, the material of the organic layer 225 may comprise hexamethyldisiloxane (HMDSO) or the like.

In some embodiments, referring to FIG. 2, the display panel may further comprise a crack stop member 204. The crack stop member 204 is located on one side of the driving circuit layer 102 away from the substrate 101, and located between the at least one dam 203/203' and the hole V. For example, the material of the crack stop member 204 may comprise metal.

The crack stop member 204 may block crack, produced during cutting to form the hole V, from extending to one side away from the hole V, thereby reducing an adverse effect on the display panel and improving the display effect of the display panel.

Figure 3:
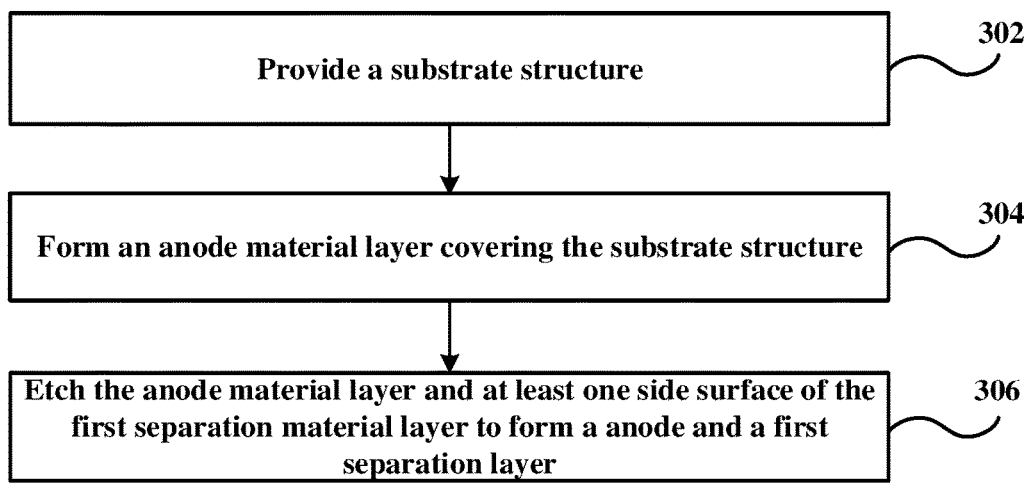
FIG. 3 is a schematic flowchart showing a method for manufacturing a display panel according to an embodiment of the present disclosure.

FIG. 3 is a schematic flowchart showing a manufacturing method of a display panel according to an embodiment of the present disclosure. FIGS. 4A-4J are schematic cross-sectional views showing structures obtained at different stages of forming a display panel according to some embodiments of the present disclosure.

The manufacturing process of the display panel according to some embodiments of the present disclosure will be described below in conjunction with FIGS. 3 and 4A-4J.

At step 302, a substrate structure is provided.

Figure 4A:
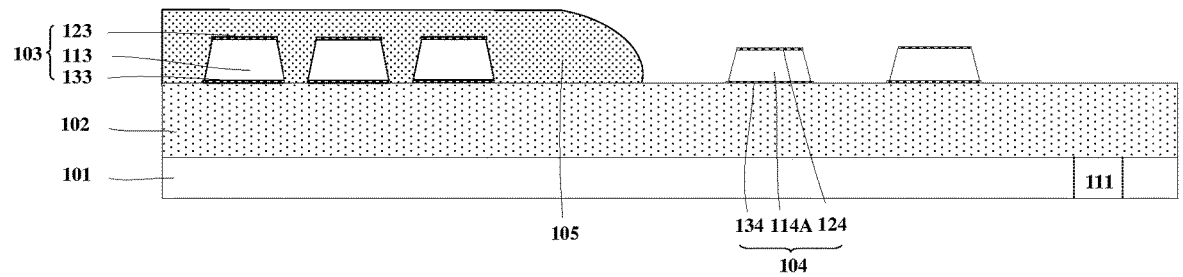
FIGS. 4A-4J are schematic cross-sectional views showing structures obtained at different stages of forming a display panel according to some embodiments of the present disclosure.

As shown in FIG. 4A, the substrate structure comprises a substrate 101, a driving circuit layer 102 located on one side of the substrate 101, a trace 103, one or more separators 104, and a planarization layer 105.

The substrate 101 comprises a first area 111 for forming a hole V of a display area. The separator 104 is arranged around the first area 111.

The driving circuit layer 102 comprises a thin film transistor. It should be understood that the driving circuit layer 102 may comprise a pixel driving circuit, which may comprise a plurality of thin film transistors, such as a driving transistor, a switching transistor or the like. The pixel driving circuit may also comprise a capacitor or the like.

The trace 103 is located on one side of the driving circuit layer 102 away from the substrate 101 and connected to a thin film transistor (for example, a driving transistor). For example, the trace 103 may comprise a first trace layer 113, a second trace layer 123, and a third trace layer 133. The second trace layer 123 is located on one side of the first trace layer 113 away from the driving circuit layer 102, and the third trace layer 133 is located on one side of the first trace layer 113 close to the driving circuit layer 102.

The separator 104 is located on one side of the driving circuit layer 102 away from the substrate 101. At least one separator 104 comprises a first separation material layer 114A and a second separation layer 124 located on one side of the first separation material layer 114A away from the driving circuit layer 102. In some implementations, the separator 104 may further comprise a third separation layer 134. The third separation layer 134 is located on one side of the first separation material layer 114 close to the driving circuit layer 101.

For example, the first trace layer 113 and the first separation material layer 114A may be formed by a same patterning process (referred to as a first patterning process), and the second trace layer 123 and the second separation layer 124 may be formed by a same patterning process (referred to as a second patterning process), and the third trace layer 133 and the third separation layer 134 may be formed by a same patterning process (referred to as a third patterning process).

The planarization layer 105 is located on one side of the driving circuit layer 102 away from the substrate 101 and covers the trace 103. Here, the planarization layer 105 does not overlap with the one or more separators 104.

Figure 4B:
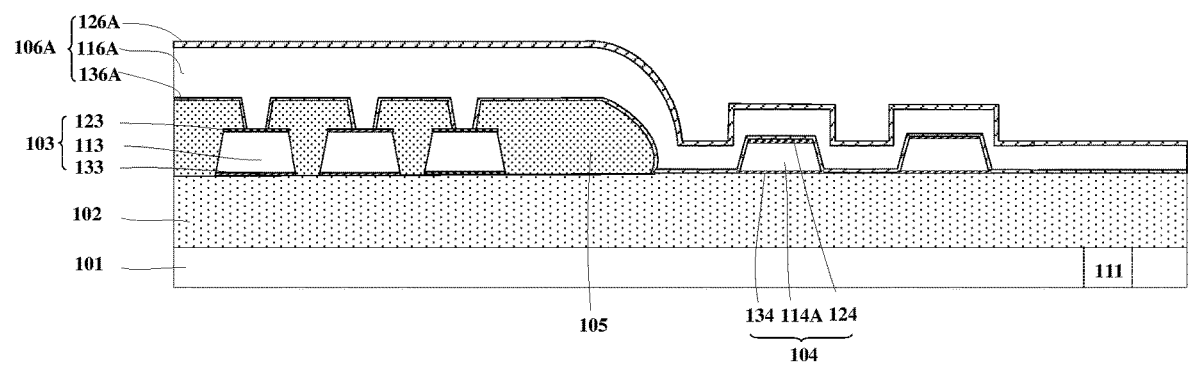

At step 304, an anode material layer 106A covering the substrate structure shown in FIG. 4A is formed as shown in FIG. 4B. In some implementations, the anode material layer 106A may comprise a first anode material layer 116A, a second anode material layer 126A located on one side of the first anode material layer 116A away from the substrate 101, and a third anode material layer 136A located on one side of the first anode material layer 116A close to the substrate 101.

For example, the materials of the second anode material layer 126A and the third anode material layer 136A may comprise indium tin oxide. For example, the material of the first anode material layer 116A may comprise silver.

At step 306, the anode material layer 106A and at least one side surface of the first separation material layer 114A are etched to form the anode 106 and the first separation layer 114. It should be understood that side surfaces of the first separation material layer 114A comprise a side surface close to the hole V and a side surface away from the hole V.

Here, the formed anode 106 is connected to the trace 103 through a via hole penetrating through the planarization layer 105. In addition, the orthographic projection of one surface of the first separation layer 114 away from the substrate 101 on the substrate 101 is within the orthographic projection of the second separation layer 124 on the substrate 101.

In some implementations, the anode 106 and the first separation layer 114 may be formed by using a single etching process. In other implementations, the anode 106 and the first separation layer 114 may be formed by using two etching processes.

Some implementations of forming the anode 106 and the first separation layer 114 by using two etching processes will be introduced below.

Figure 4C:
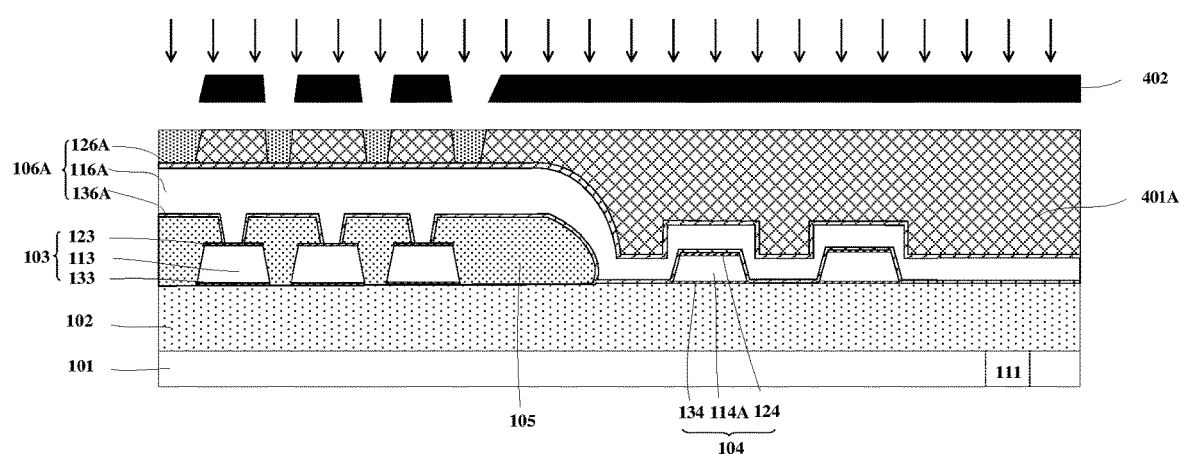
Figure 4D:
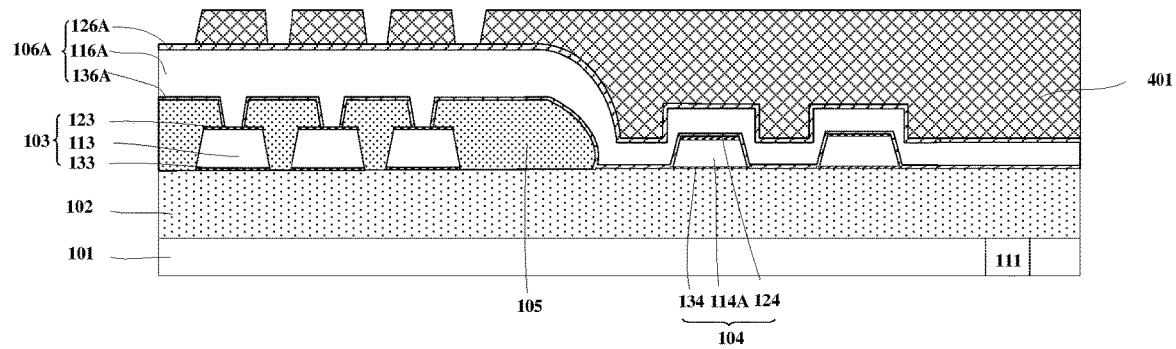

As shown in FIG. 4C and FIG. 4D, a first mask 401 is formed on one side of the anode material layer 106A away from the substrate 101.

As shown in FIG. 4C, a first mask material layer 401A is formed on one side of the anode material layer 106A away from the substrate 101. For example, the material of the first mask material layer 401A may comprise a photoresist, for example a positive photoresist as shown in FIG. 4C. It should be understood that the material of the first mask material layer 401A may also comprise a negative photoresist.

The first mask material layer 401A is patterned (for example exposed and developed) by using the first mask plate 402, so that a first mask 401 as shown in FIG. 4D is formed. Here, for the purpose of illustration, a portion of the anode material layer 106A covering the planarization layer 105 is referred to as a first anode material layer, and a portion of the anode material layer 106A covering the one or more separators 104 is referred to as a second anode material layer. Therefore, the anode material layer 106A may comprise a first anode material layer covering the planarization layer 105 and a second anode material layer adjacent to the first anode material layer and covering one or more separators 104. Here, the first mask 401 exposes a portion of the first anode material layer covering the planarization layer 105.

Figure 4E:
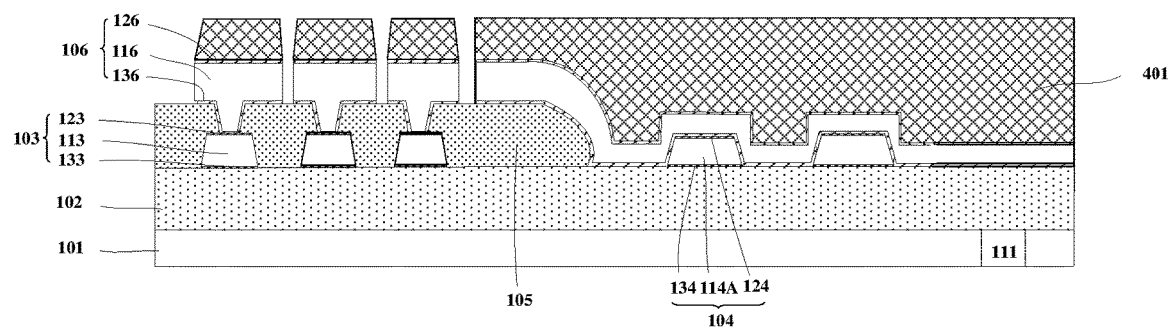

As shown in FIG. 4E, a first etching is performed on the exposed portion of the first anode material layer to form the anode 106, with the first mask 401 as a mask. Here, the anode 106 is connected to the trace 103 through a via hole penetrating through the planarization layer 105.

For example, the first etching for forming the anode 106 may comprise wet etching. As some examples, the etching solution used during the first etching may comprise nitric acid or phosphoric acid.

During the first etching, since the first mask 401 covers the second anode material layer above the separator 104, the second anode material layer will not be etched. In this way, the first separation material layer 114A will not be exposed, thereby avoiding that metal particles (for example, Ag particles) contained in the first anode material layer 116A are produced due to a displacement reaction between ions (Ag+) produced after the etching solution comes into contact with the first anode material layer 116A (for example, Ag) and the first separation material layer 114A (for example, Al). In this way, the metal particles produced by the displacement reaction are prevented from being adsorbed on the surface of the anode 106 and further producing an adverse effect on the light emitting device layer that is subsequently formed.

Figure 4F:
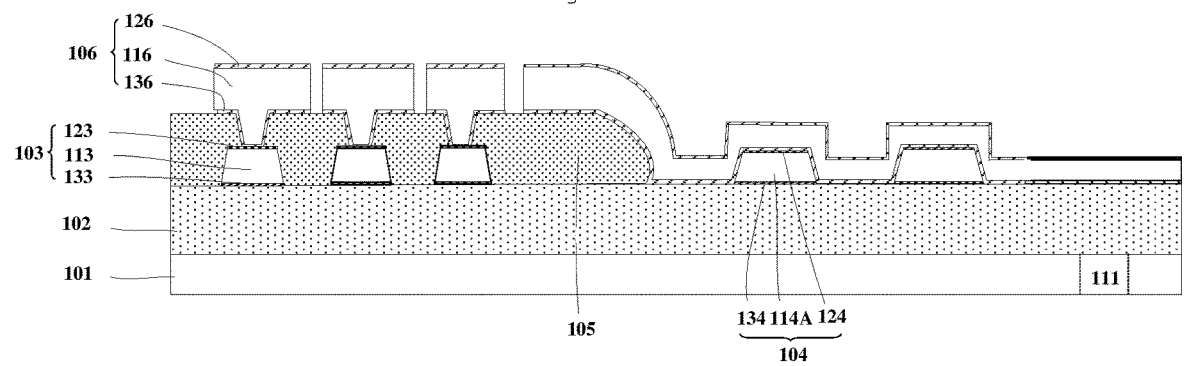

As shown in FIG. 4F, the first mask 401 is removed. For example, the first mask 401 may be removed by using a lift-off process.

Figure 4G:
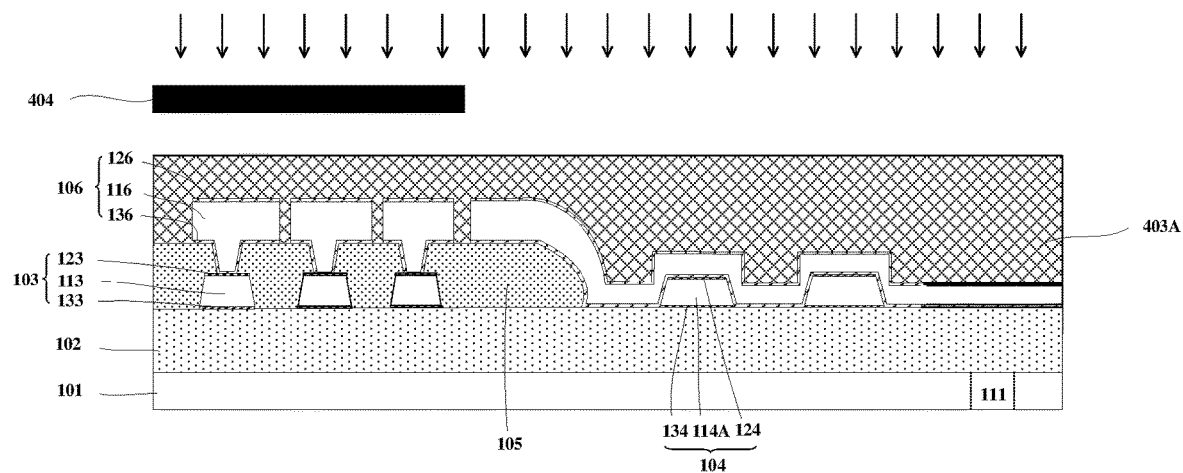
Figure 4H:
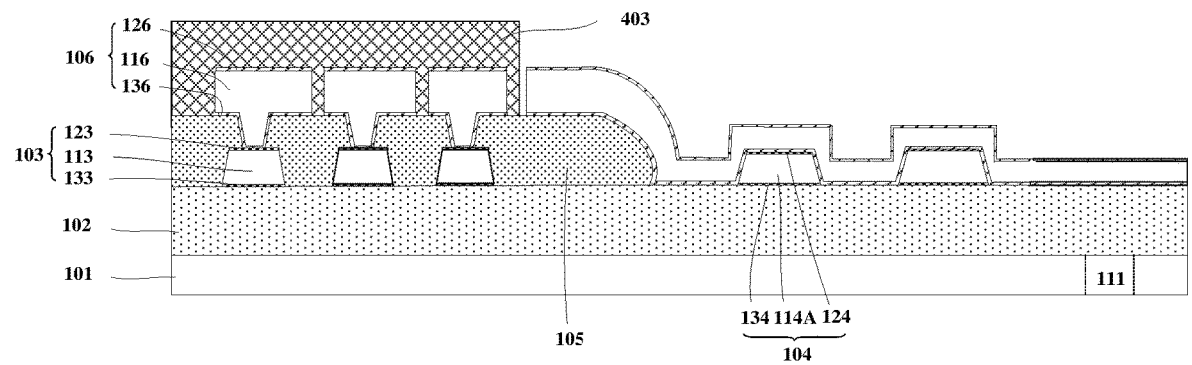

As shown in FIGS. 4G and 4H, a second mask 403 covering the anode 106 is formed.

As shown in FIG. 4G, a second mask material layer 403A covering the anode 106 and a remaining portion of the anode material layer 106A is formed. The material of the second mask material layer 403A may comprise a photoresist, such as a positive photoresist.

The second mask material layer 403A is patterned (for example, exposed and developed) by using the second mask plate 404, so that the second mask 403 as shown in FIG. 4H may be formed. As shown in FIG. 4H, the second mask 403 exposes the remaining portion of the first anode material layer and the second anode material layer. In other words, the second mask 403 may expose a portion (i.e., a remaining portion) of the anode material layer 106A that is not etched during the first etching.

Figure 4I:
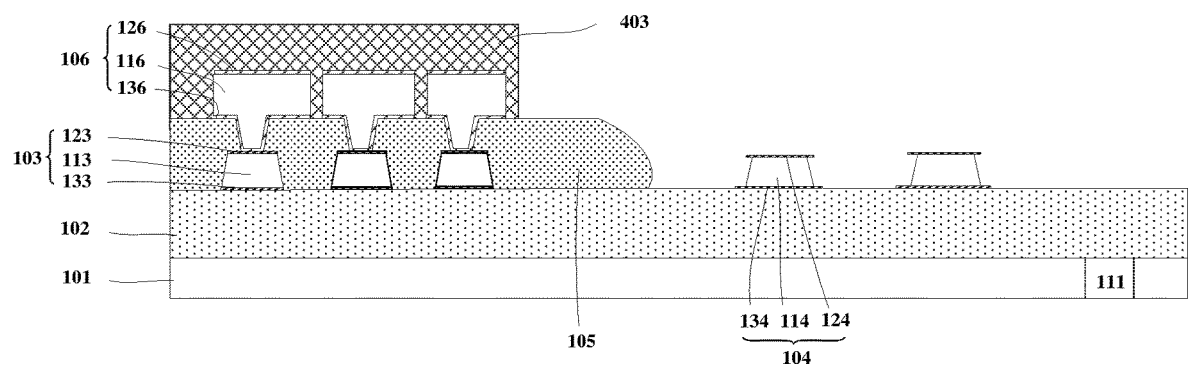

As shown in FIG. 4I, a second etching is performed on the remaining portion of the first anode material layer, the second anode material layer, and at least one side surface of the first separation material layer 114A to form a first separation layer 114, with the second mask 403 as a mask. For example, the second etching for forming the first separation layer 114 may comprise wet etching. As some examples, the etching solution used in the second etching may comprise nitric acid or phosphoric acid.

It should be understood that before the second etching, the orthographic projection of one surface of the first separation material layer 114A away from the substrate 101 on the substrate 101 completely coincides with the orthographic projection of the second separation layer 124 on the substrate 101. After the second etching, at least one side surface of the first separation material layer 114A is etched, and the orthographic projection of the formed first separation layer 114 away from the substrate 101 on the substrate 101 is within the orthographic projection of the second separation layer 124 on the substrate 101.

During the second etching, the second mask 403 covers the anode 106, thereby avoiding that metal particles (for example, Ag particles) contained in the first anode layer 116 are produced due to a displacement reaction between ions (Ag+) produced after the etching solution comes into contact with the first anode layer 116 (for example, Ag) and the first separation material layer 114A (for example, Al). In this way, the metal particles produced by the displacement reaction are prevented from being adsorbed on the surface of the anode 106 and further producing an adverse effect on the light emitting device layer that is subsequently formed.

Figure 4J:
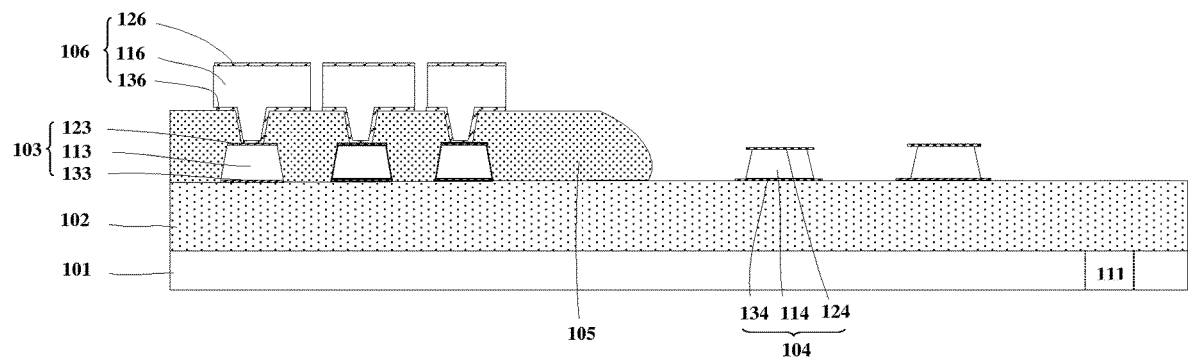

As shown in FIG. 4J, the second mask 403 is removed.

After that, a pixel defining layer, a light emitting device layer (comprising a functional layer and a cathode), and an encapsulation layer may be sequentially formed. Then, the driving circuit layer 102, the light emitting device layer, and the encapsulation layer which are directly above the first area 111 of the substrate 101 may be etched (for example, laser etched) to form a hole V penetrating through the display panel. After that, a camera, a sensor or the like may be mounted within the hole V.

The display panel formed in the above implementations is favorable for implementing that the light emitting device layer formed above the separator is spaced apart from the light emitting device layer formed above the anode, so that moisture and oxygen entering the light emitting device layer from the hole can be blocked from diffusing to the light emitting device layer above the anode, thereby reducing an adverse effect on the light emitting device, and improving the display effect of the display panel.

In addition, in the above implementations, it is avoided that metal particles (for example, Ag particles) contained in the first anode material layer 116A/first anode layer 116 are produced due to a displacement reaction between ions (Ag+) produced after the etching solution comes into contact with the first anode material layer 116A/first anode layer 116 (for example, Ag) and the first separation material layer 114A (for example, Al). Therefore, the adverse effect on the light emitting device layer that is subsequently formed (for example, abnormal dark spots are rendered), resulting from the metal particles produced by the displacement reaction and being adsorbed on the surface of the anode 106, is prevented.

The embodiments of the present disclosure also provide a display device, which may comprise the display panel according to any one of the above embodiments. In some embodiments, the display device may comprise any product or member having a display function, such as a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel comprising a hole located at a display area, the display panel comprising:
  a substrate;
  a driving circuit layer located on one side of the substrate and comprising a thin film transistor;
  a trace located on one side of the driving circuit layer away from the substrate and connected to the thin film transistor;
  one or more separators surrounding the hole, located on one side of the driving circuit layer away from the substrate and located between the trace and the hole, wherein at least one separator of the one or more separators comprises:
  a first separation layer, and
  a second separation layer located on one side of the first separation layer away from the driving circuit layer, wherein an orthographic projection of one surface of the first separation layer away from the substrate on the substrate is within an orthographic projection of the second separation layer on the substrate;

a planarization layer located on the one side of the driving circuit layer away from the substrate and covering the trace, the planarization layer not overlapping with the one or more separators; and an anode located on one side of the planarization layer away from the driving circuit layer and connected to the trace through a via hole penetrating through the planarization layer, wherein the one or more separators is located between an edge of the planarization layer close to the hole and the hole.

2. The display panel according to claim 1, wherein the at least one separator further comprises:

a third separation layer located on one side of the first separation layer close to the driving circuit layer, wherein an orthographic projection of the first separation layer on the substrate is within an orthographic projection of the third separation layer on the substrate.

3. The display panel according to claim 2, wherein the trace comprises:

a first trace layer, wherein a material of the first trace layer is the same as a material of the first separation layer;

a second trace layer located on one side of the first trace layer away from the driving circuit layer, wherein a material of the second trace layer is the same as a material of the second separation layer; and a third trace layer located on one side of the first trace layer close to the driving circuit layer, wherein a material of the third trace layer is the same as a material of the third separation layer.

4. The display panel according to claim 1, further comprising a light emitting device layer, wherein the light emitting device layer comprises:

a first light emitting device layer located on the anode and extending to the driving circuit layer on one side of the at least one separator away from the hole; and a second light emitting device layer located on the second separation layer and spaced apart from the first light emitting device layer.

5. The display panel according to claim 4, wherein the light emitting device layer further comprises:

a third light emitting device layer extending from an edge of the hole to the driving circuit layer on one side of the at least one separator close to the hole, third light emitting device layer being spaced apart from the second light emitting device layer.

6. The display panel according to claim 4, wherein the light emitting device layer further comprises:

a fourth light emitting device layer located on the driving circuit layer between adjacent separators of the one or more separators, the fourth light emitting device layer being spaced apart from the second light emitting device layer.

7. The display panel according to claim 4, wherein the light emitting device layer comprises a functional layer and a cathode located on one side of the functional layer away from the substrate.

8. The display panel according to claim 1, further comprising:

at least one dam surrounding the hole and located on the one side of the driving circuit layer away from the substrate, wherein the one or more separators are located between the planarization layer and the at least one dam.

9. The display panel according to claim 8, further comprising:

a crack stop member located on the one side of the driving circuit layer away from the substrate and located between the at least one dam and the hole.

10. The display panel according to claim 1, wherein the anode comprises:

a first anode layer;

a second anode layer located on one side of the first anode layer away from the driving circuit layer; and a third anode layer located on one side of the first anode layer close to the driving circuit layer.

11. The display panel according to claim 10, wherein materials of the second anode layer and the third anode layer comprise indium tin oxide, and a material of the first anode layer comprises silver.

12. The display panel according to claim 2, wherein materials of the second separation layer and the third separation layer comprise titanium, and a material of the first separation layer comprises aluminum or molybdenum.

13. A display device, comprising the display panel according to claim 1.

14. A method for manufacturing a display panel, comprising:

providing a substrate structure, wherein the substrate structure comprises:

a substrate comprising a first area for forming a hole of a display area, a driving circuit layer located on one side of the substrate and comprising a thin film transistor, a trace located on one side of the driving circuit layer away from the substrate and connected to the thin film transistor, one or more separators surrounding the first area and located on the one side of the driving circuit layer away from the substrate, wherein at least one separator of the one or more separators comprises a first separation material layer and a second separation layer located on one side of the first separation material layer away from the driving circuit layer, and a planarization layer located on one side of the driving circuit layer away from the substrate and covering the trace, the planarization layer not overlapping with the one or more separators;

forming an anode material layer covering the substrate structure; and etching the anode material layer and at least one side surface of the first separation material layer to form an anode and a first separation layer, wherein the anode is connected to the trace through a via hole penetrating through the planarization layer, and an orthographic projection of one surface of the first separation layer away from the substrate on the substrate is within an orthographic projection of the second separation layer on the substrate, wherein the one or more separators is located between an edge of the planarization layer close to the hole and the hole.

15. The method according to claim 14, wherein etching the anode material layer and at least one side surface of the first separation material layer comprises:

forming a first mask on one side of the anode material layer away from the substrate, wherein the anode material layer comprises a first anode material layer covering the planarization layer, and a second anode material layer adjacent to the first anode material layer and covering the one or more separators, and the first mask exposes a portion of the first anode material layer;

performing a first etching, with the first mask as a mask, on the exposed portion of the first anode material layer to form the anode;

removing the first mask;

forming a second mask covering the anode, wherein the second mask exposes the second anode material layer and a remaining portion of the first anode material layer;

perform a second etching, with the second mask as a mask, on the second anode material layer, the remaining portion of the first anode material layer, and the at least one side surface of the first separation material layer to form the first separation layer; and removing the second mask.

16. The method according to claim 14, wherein the at least one separator further comprises:

a third separation layer located on one side of the first separation layer close to the driving circuit layer, wherein an orthographic projection of the first separation layer on the substrate is within an orthographic projection of the third separation layer on the substrate.

17. The method according to claim 16, wherein the trace comprises:

a first trace layer;

a second trace layer located on one side of the first trace layer away from the driving circuit layer; and a third trace layer located on one side of the first trace layer close to the driving circuit layer, wherein:

the first trace layer and the first separation material layer are formed by a first patterning process, the second trace layer and the second separation layer are formed by a second patterning process, and the third trace layer and the third separation layer are formed by a third patterning process.

18. The method according to claim 15, wherein each of the first etching and the second etching comprises wet etching.

19. The method according to claim 14, further comprising forming a light emitting device layer, wherein the light emitting device layer comprises:

a first light emitting device layer located on the anode and extending to the driving circuit layer on one side of the at least one separator away from the hole; and a second light emitting device layer located on the second separation layer and spaced apart from the first light emitting device layer.

20. The method according to claim 19, wherein the light emitting device layer further comprises:

a third light emitting device layer extending from an edge of the hole to the driving circuit layer on one side of the at least one separator close to the hole, the third light emitting device layer being spaced apart from the second light emitting device layer.

* * * * *